(12) United States Patent
Dufrene et al.

(10) Patent No.: US 8,867,665 B2
(45) Date of Patent: Oct. 21, 2014

(54) COMMUNICATION SYSTEMS AND METHODS SUPPORTING MULTIPLE MODULATION TECHNIQUES

(71) Applicant: Intel Mobile Communications GmbH, Neubiberg (DE)

(72) Inventors: Krzysztof Dufrene, Plesching (AT); Harald Pretl, Schwertberg (AT); Patrick Ossmann, Linz (AT); Jan Zaleski, Linz (AT); Christian Mayer, Linz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/755,511

(22) Filed: Jan. 31, 2013

(65) Prior Publication Data

US 2014/0211870 A1    Jul. 31, 2014

(51) Int. Cl.
    *H03C 3/00*        (2006.01)
    *H03K 7/06*        (2006.01)
    *H04L 27/12*       (2006.01)
    *H04L 27/00*       (2006.01)

(52) U.S. Cl.
    CPC .................................. *H04L 27/0008* (2013.01)
    USPC ........................................ 375/302; 375/295

(58) Field of Classification Search
    USPC ....................................................... 375/302
    See application file for complete search history.

(56) References Cited

U.S. PATENT DOCUMENTS

| | | | |
|---|---|---|---|
| 7,023,292 B2 | 4/2006 | Pehlke et al. | |
| 8,259,822 B1 | 9/2012 | Feher | |
| 8,462,035 B2 * | 6/2013 | Schimper et al. | 341/145 |
| 8,502,610 B2 * | 8/2013 | Pellon et al. | 331/46 |
| 2010/0254490 A1 * | 10/2010 | Moreira | 375/300 |
| 2012/0286984 A1 * | 11/2012 | Schimper et al. | 341/144 |
| 2013/0106634 A1 * | 5/2013 | Savoj | 341/144 |
| 2013/0200925 A1 * | 8/2013 | Moreira | 327/107 |
| 2013/0203366 A1 * | 8/2013 | Moreira | 455/110 |

OTHER PUBLICATIONS

Debopriyo Chowdhury, et al.; "An Efficient Mixed-Signal 2.4-GHz Polar Power Amplifier in 65-nm CMOS Technology", IEEE Journal of Solid-State Circuits, vol. 46, No. 8, Aug. 2011, p. 1796-1809.

\* cited by examiner

*Primary Examiner* — Erin File
(74) *Attorney, Agent, or Firm* — Eschweiler & Associates, LLC

(57) ABSTRACT

A communication system includes a first DAC array, a second DAC array, and a merge component. The first DAC array is configured to receive a first portion of modulation signals and to generate a first RF signal according to a modulation mode. The second DAC array is configured to receive a second portion of the modulation signals and to generate a second RF signal according to the modulation mode. The merge component is configured to receive the first RF signal and the second RF signal. The merge component is also configured to generate an output RF signal according to the first RF signal and the second RF signal, wherein the output RF signal has a modulation format according to the modulation mode.

22 Claims, 9 Drawing Sheets

COMMUNICATION SYSTEMS AND METHODS SUPPORTING MULTIPLE MODULATION TECHNIQUES

BACKGROUND

Wireless power amplifiers are increasingly important for wireless applications. Information to be communicated is presented according to a particular modulation format. The information is then amplified by the wireless amplifiers prior to transmission.

The wireless amplifiers have selectable or designable properties including gain, linearity, and efficiency. The amplifier properties are selected according to device requirements and/or system requirements, and can include a particular modulation technique, such as polar modulation technique, quadrature modulation technique, and the like.

There are a variety of modulation techniques that can be utilized for different purposes. For example, quadrature modulation techniques are typically used for very large bandwidth signals. Polar modulation techniques are used for general power-efficient communication systems, including cellular systems.

Some recent communication systems employ two modulation techniques to cover varied purposes. However, since wireless amplifiers are typically designed for a specific modulation technique, using two modulation techniques can be difficult to implement. In fact, such systems could require multiple amplifiers specific to each modulation technique.

DETAILED DESCRIPTION

Figure 1:
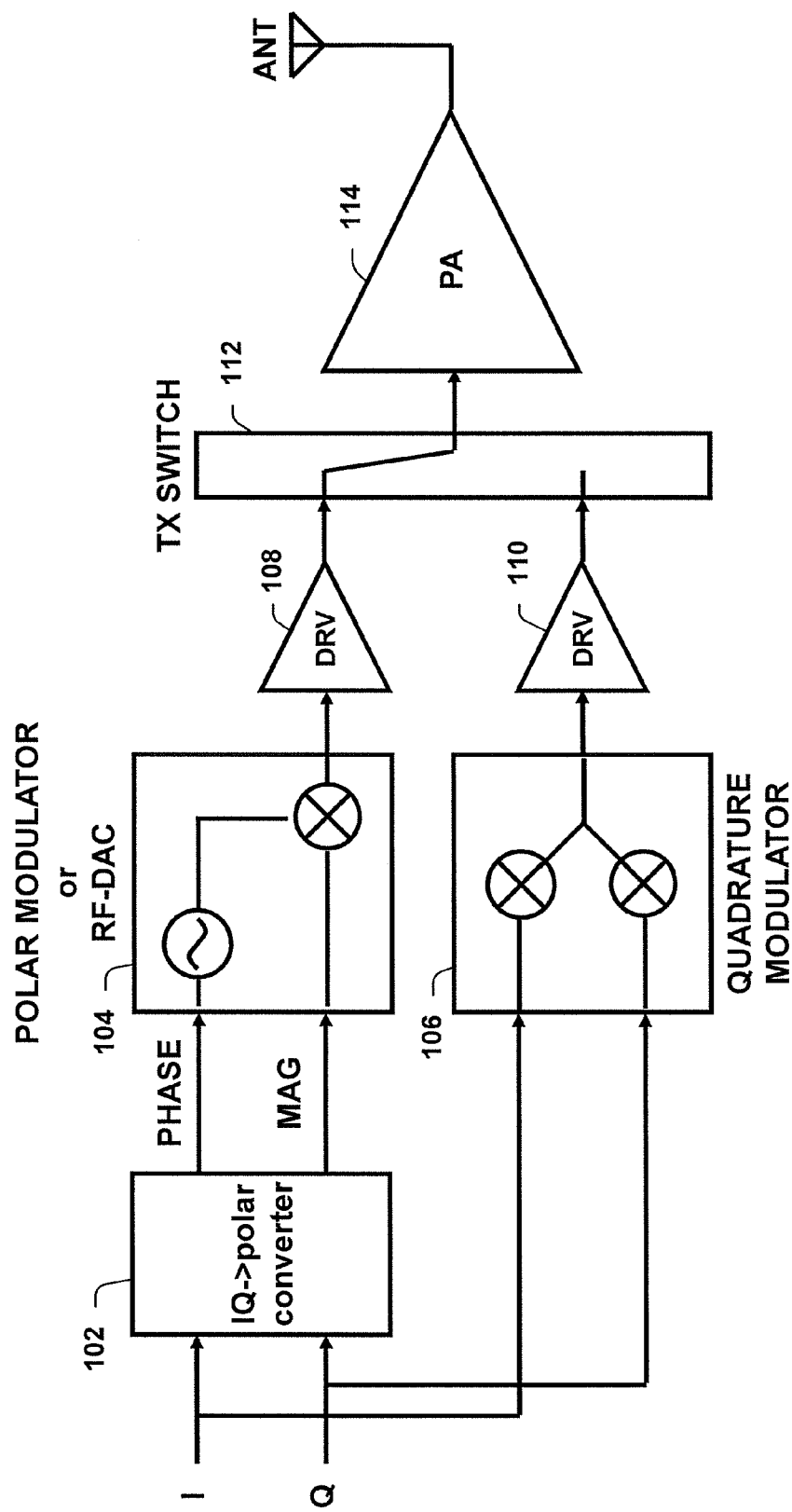
FIG. 1 is a diagram of a conventional wireless transmission system.

The present invention will now be described with reference to the attached drawing figures, wherein like reference numerals are used to refer to like elements throughout, and wherein the illustrated structures and devices are not necessarily drawn to scale.

Systems and methods are disclosed that provide an amplifier and digital to analog converter (DAC)/modulator systems that supports a plurality of modulation modes.

FIG. 1 is a diagram of a conventional wireless transmission system 100. The system 100 receives baseband quadrature signals (I and Q) carrying information and outputs an RF signal based on quadrature or polar modulation. The system 100 includes a quadrature mode and a polar mode. The system 100 includes a polar converter 102, an RF-DAC 104, an quadrature modulator 106, an polar driver 108, an quadrature driver 110, a transmit (TX) switch 112 and a power amplifier 114. The RF-DAC 104 is a RF digital to analog converter.

For the polar mode, the inputs are converted into phase modulation and amplitude modulation components by the polar converter 102. For example, a CORDIC algorithm can be used. The phase modulation signal is used to phase modulate a transmit (TX) carrier signal by means of a phase locked loop (PLL) or a PLL followed by a digital to time converter (DTC). The amplitude modulation is applied by multiplying the amplitude modulation signal with a phase modulated local oscillator (LO) signal within the RF-DAC 104.

The polar driver 108 amplifies the RF signal, which is selectively provided to the output power amplifier 114 via the TX switch 112. The TX switch 112 selects the path corresponding to the quadrature or polar modulation mode being used.

The quadrature modulator 106 combines the quadrature signals into a quadrature RF signal. The quadrature driver 110 amplifies the quadrature RF signal, which is selectively provided to the power amplifier 114 via the TX switch 112. The path for the quadrature driver 110 is selected for operation in the quadrature modulation mode.

The power amplifier 114 amplifies the signal received at its input for transmission via an antenna as shown.

The system 100 is able to provide an output RF signal generated using either a quadrature or polar modulation technique. However, a tremendous amount of chip area is required to provide all the components. Further, the RF TX switch 112 introduces extra complexity and cost, whether external or internal. Finally, the RF TX switch deteriorates the TX signal level of the output RF signal.

Figure 2:
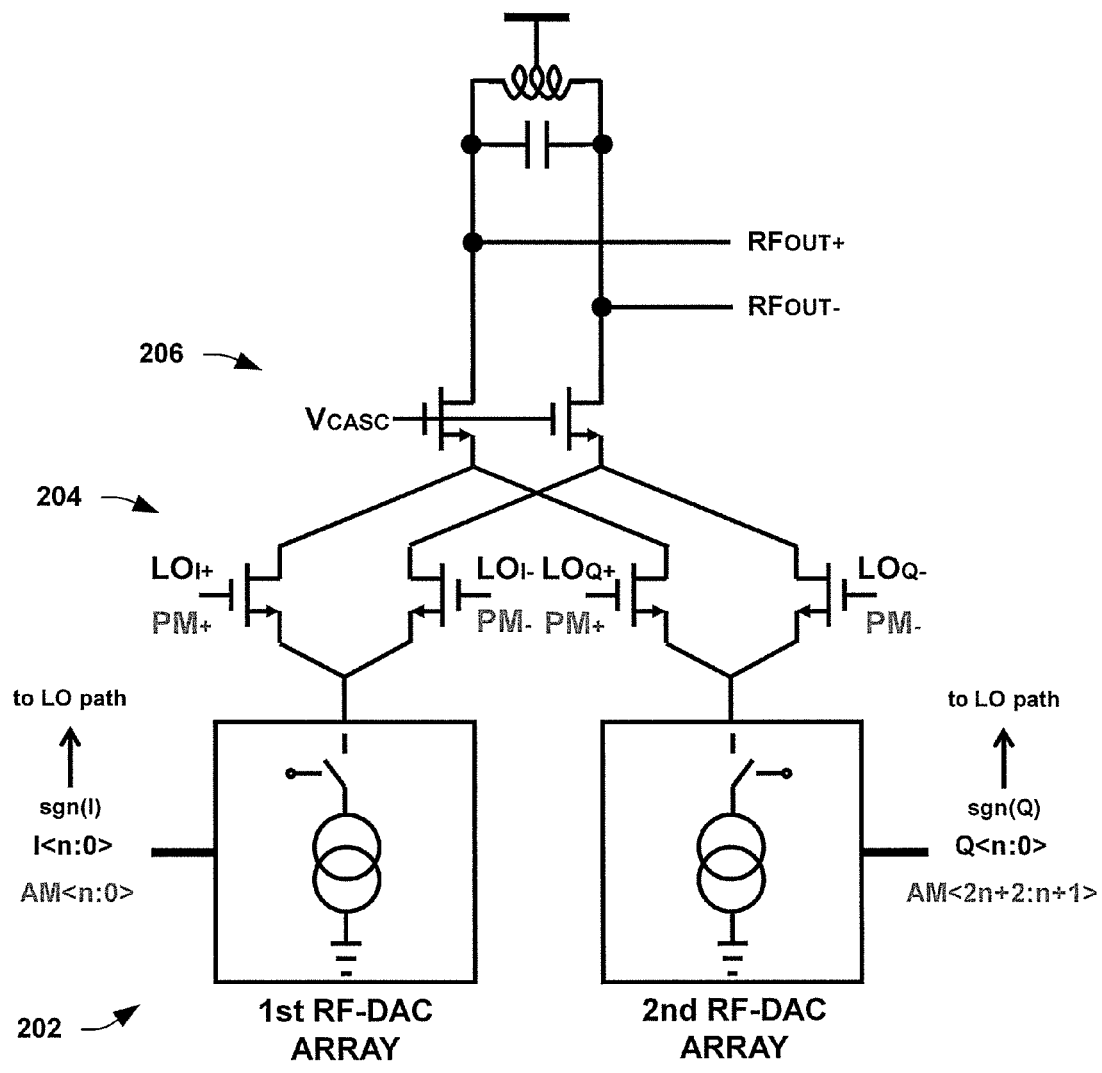
FIG. 2 is a diagram illustrating a transmission system for transmitting with quadrature or polar modulation having two halves.

FIG. 2 is a diagram illustrating a transmission system 200 for transmitting with quadrature or polar modulation having two halves. The system receives baseband signals in quadrature or polar modulation format and generates an RFOUT signal. The RFOUT signal still needs to be driven with a separate power amplifier as in FIG. 1.

The system 200 includes unit cells 202 and RF mixers 204. The unit cells 202 receive quadrature modulation components I and Q or amplitude modulation components (AM). The RF mixers 204 receive non-phase modulated local oscillator (LO) signals or phase modulated LO signals (PM+ and PM−). The LO signals include LO inphase (LOi+ and LOi−) and LO quadrature phase LO signals (LOq+ and LOq−).

For quadrature modulation, half of the unit cells 202 are driven with I modulation components and the other half are driven with Q modulation components. Additionally, half of the RF mixers 204 are driven with inphase LO signals and another half is driven with quadrature phase LO signals. The RF mixers 204 generate first and second portions of the RF output signal, which here includes quadrature modulation.

For polar modulation, the first half of the unit cells 202 are driven with a first half of the amplitude modulation components and the second half are driven with a second half of the amplitude modulation components. The RF mixers 204 are driven with positive and negative components of the phase modulation (PM) components to generate the first and second portions of an RF output signal. The first and second portions comprise polar modulation.

The first and second portions from the RF mixers are combined and are provided as the RF output signal. The RF output signal is provided as a differential output signal and includes RFOUT+ and RFOUT−. The RF output signal requires amplification by an external power amplifier.

Figure 3:
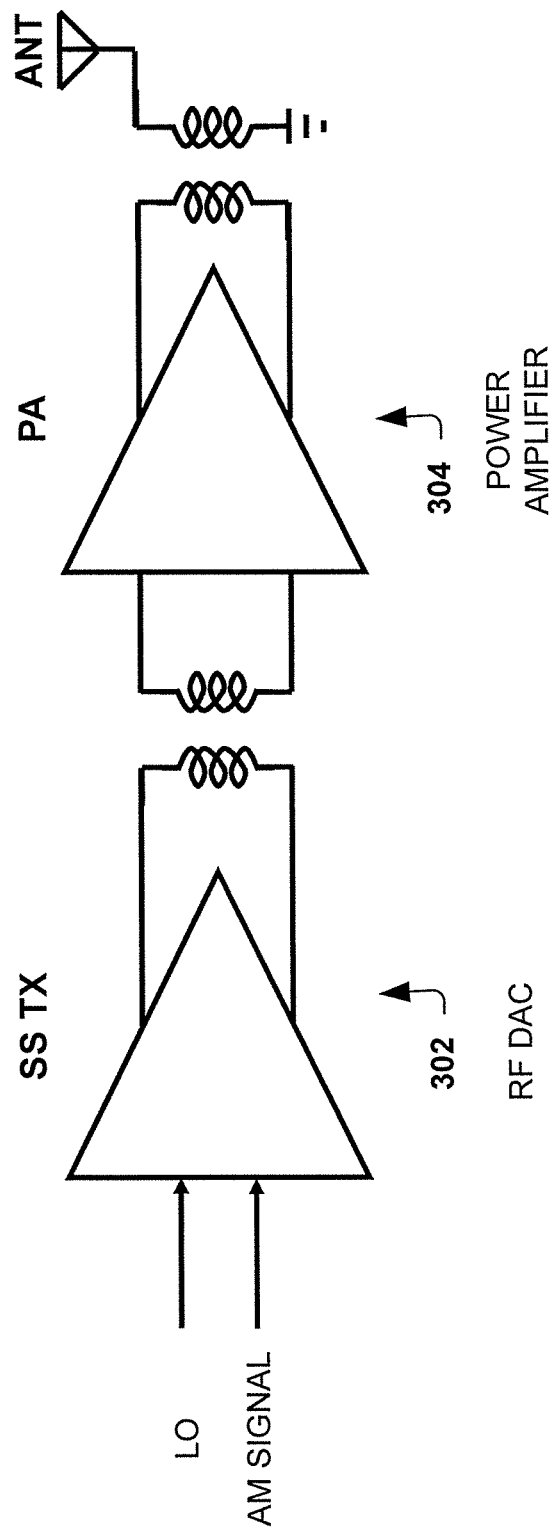
FIG. 3 is a diagram illustrating a transmission chain using separate RF-DAC and power amplifier components.

FIG. 3 is a diagram illustrating a transmission chain 300 using separate RF-DAC and power amplifier components.

The chain 300 includes an RF-DAC 302 and a power amplifier 304. The RF-DAC 302 is also referred to as a polar modulator. The RF-DAC 302 and the power amplifier 304 are located on separated integrated circuits in this example.

The RF-DAC 302 receives amplitude modulation components (AM) signal and a local oscillator (LO) signal having phase modulation components (PM). The RF-DAC 302 generates a polar modulated signal using polar modulation from the received signals.

The power amplifier 304 is external to the RF-DAC 302 and receives the polar modulated signal. The power amplifier 304 amplifies the received signal to generate an RF output signal having polar modulation. The RF output signal is then provided to an antenna for transmission.

Figure 4:
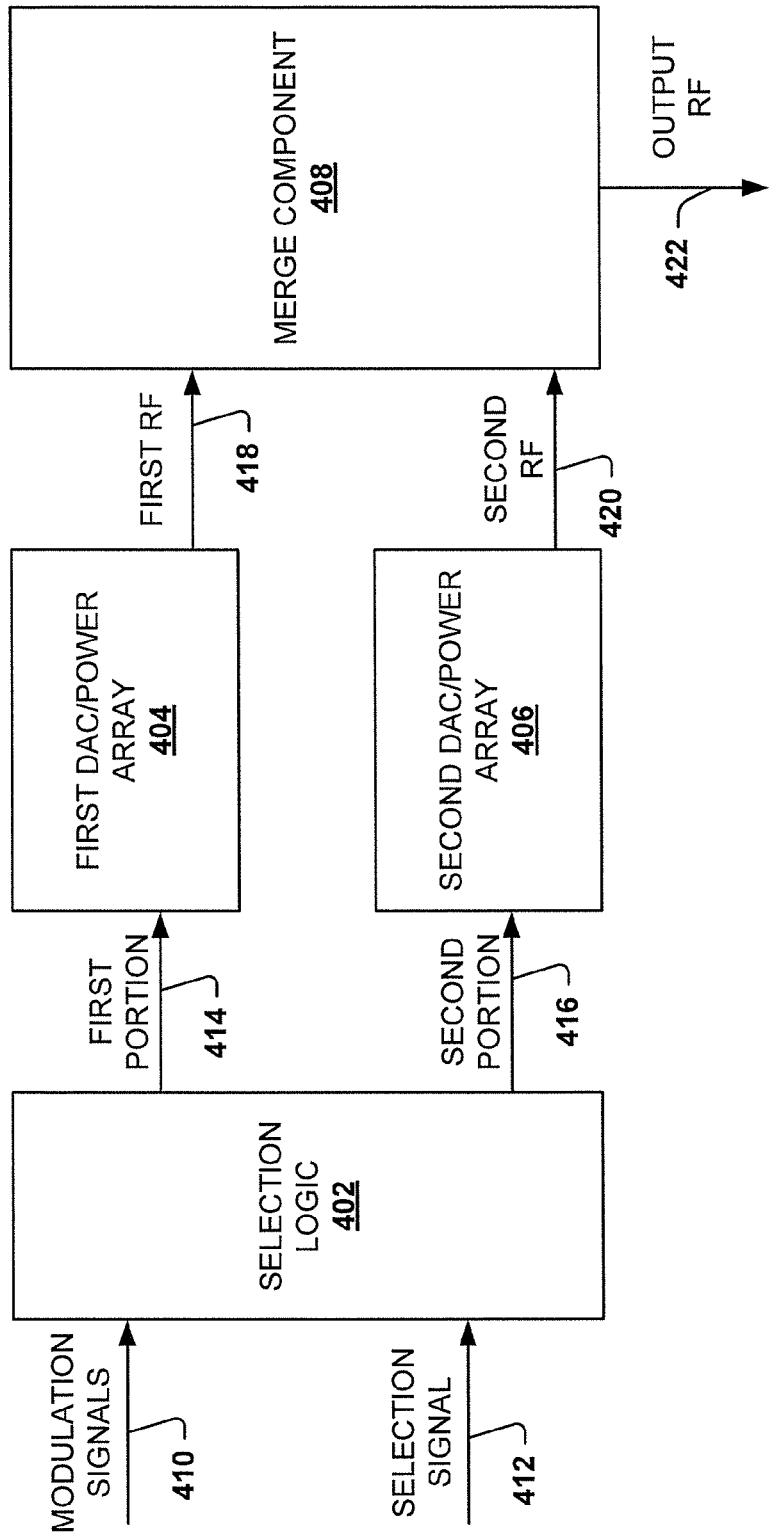
FIG. 4 is a block diagram illustrating an integrated transmission system supporting multiple modulation techniques.

FIG. 4 is a block diagram illustrating an integrated transmission system 400 supporting multiple modulation techniques. The system 400, having a selected and supported modulation mode, such as polar and quadrature modulation, receives modulation components. With reduced circuitry and integrated circuit space relative to conventional systems, the system 400 generates an output RF signal using the selected modulation mode. The system 400 may be formed into a single integrated circuit.

The system 400 includes selection logic 402, a first DAC array 404, a second DAC array 406, and a merge component 408. The selection logic 402 receives modulation signals 410 and a selection signal 412. The modulation signals 410 include one or more signals associated with a selected modulation technique. The modulation signals 410 may include, for example, polar modulation components, quadrature modulation components, and the like. In one example, the modulations signals 410 include inphase (I) and quadrature (Q) modulation components. In another example, the modulation signals 410 include amplitude modulation (AM) components and phase modulation (PM) components.

The selection signal 412 indicates the selected modulation technique to be utilized for an output RF signal 422. The selected modulation technique includes identification or selection of quadrature modulations, polar modulation, and the like techniques or modes.

The selection logic 402 separates the modulation signals 410 into multiple portions according to the selection signal 412. The selection signal 412 indicates a selected modulation mode, such as polar or quadrature modulation mode. The modulation signals 410 are digital signals and include modulation components. The signals 410 are separated into a first portion 414 and a second portion 416. In one example wherein the incoming signal includes quadrature modulation components, the first portion 414 includes inphase components (I) and inphase local oscillator signals (LOI+ and LOI−) and the second portion 416 includes quadrature components (Q0 and quadrature local oscillator signals (LOQ+ and LOQ−) for a quadrature mode. If the incoming signal include polar modulation components, the first portion 414 includes phase modulation components and a section of amplitude modulation components and the second portion 416 includes phase modulation components and a second section or half of amplitude modulation components.

The first and second DAC arrays 404 and 406 may include unit cells corresponding to the information in the modulation signals 410. The unit cells are turned on and off by a digital code word. The unit cells perform the digital to analog conversion. The output of the unit cells are buffered and combined for each of the arrays 404 and 406.

The first portion 414 of the modulation signals 410 is received by the first DAC array 404. The first DAC array 404 converts and modulates the first portion 414 into a first RF signal 418, which has the selected modulation specified by the selection signal 412. A suitable mechanism is used by the first DAC array 404 to generate the first RF signal 418. Some examples of suitable mechanisms are described below. In one example, the first DAC array 404 includes a selected number of units used for processing the first portion 414.

The second portion 416 of the modulation signals 410 is received by the second DAC array 406. The second DAC array 406 converts and/or modulates the second portion 416 into a second RF signal 420, which also has the selected modulation specified by the selection signal 412. A suitable mechanism is used by the second DAC array 406 to generate the second RF signal 420. Some examples of suitable mechanisms are described below. In one example, the second DAC array 406 includes a selected number of units used for processing the second portion 416.

The first and second DAC arrays 404 and 406 may include modulation components and drivers to amplify the RF signals 418 and 420.

The merge component 408 receives the first and second RF signals 418 and 420 and combines them into a single output RF signal 422. In one example, the merge component 408 is a summation component that combines the signals 418 and 420 into the single RF signal 422. In another example, the merge component 408 is a node that connects the signals together to generate the output RF signal 422.

The output RF signal 422 has the selected modulation as specified in the selection signal 412.

The system 400 can switch to another modulation mechanism by altering the selection signal 412 to select a different modulation mechanism.

Figure 5:
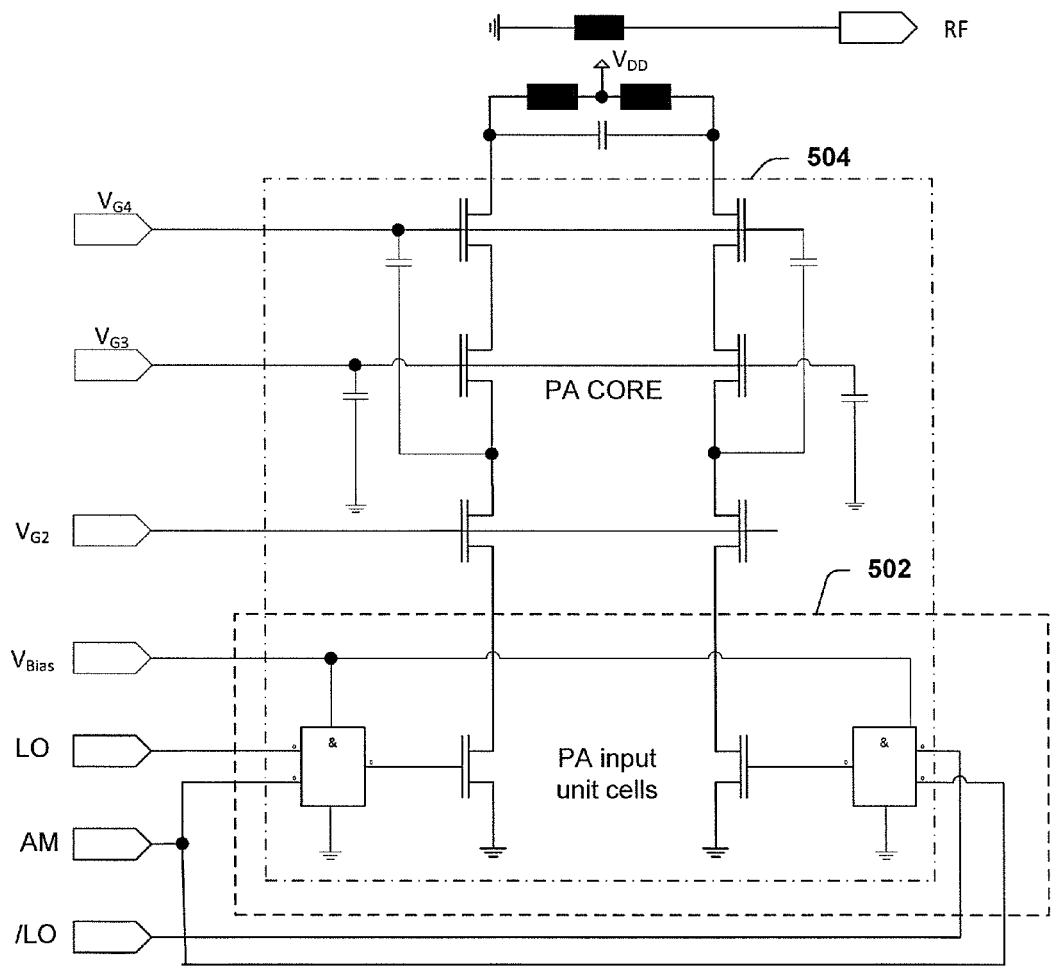
FIG. 5 is a diagram illustrating an integrated power DAC that can be configured for use with a transmission system.

FIG. 5 is a diagram illustrating a power DAC 500 that can be configured for use with the system 400 and variations thereof. The power DAC 500 is an integrated current steering DAC.

The power DAC 500 is shown supporting polar modulation for illustrative purposes. However, the power DAC 500 may be configured to support polar modulation, quadrature modulation, and/or other modulation techniques.

The power DAC 500 includes a power amplifier core region 504 and power amplifier input unit cells 502. The power amplifier core region 504 includes the input unit cells 502. The input unit cells 502 receive an incoming signal. The core region 504 includes a cascode structure to buffer RF voltage stress and is also referred to as a cascode buffering stage.

The unit cells 502 include a number of cells corresponding to the information in the incoming signal. In one example, the number of cells is equal to 1024. The unit cells 502 receive signals including local oscillator signals (LO) and an amplitude modulation signal (AM). The unit cells 502 additionally receive a bias voltage ($V_{BIAS}$).

The unit cells 502 perform the required modulation, for example, polar modulation. The unit cells 502 provide the power amplifier core region 504 with a polar modulated signal having amplitude modulation components and polar modulation components. Further, unlike the DAC and power amplifier of FIG. 3, the unit cells 502 and the power amplifier core 504 are integrated into the same circuit. This integration reduces complexity and cost.

The unit cells 502 can be configured to provide a selected modulation format. For example, the unit cells 502 can be configured to modulate in polar format, quadrature format, and the like.

Figure 6:
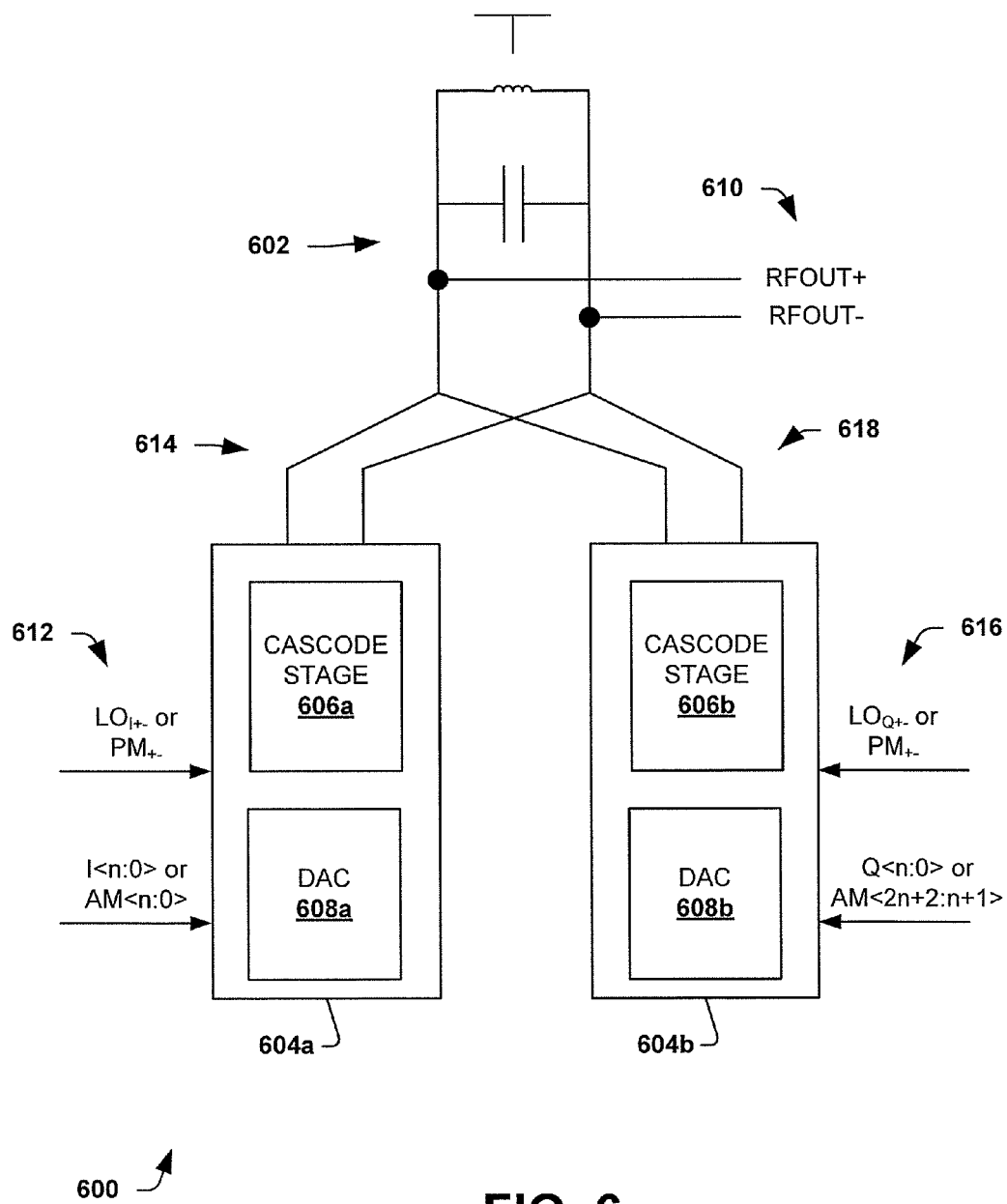
FIG. 6 is a diagram illustrating a dual mode current steering power amplifier DAC array system.

FIG. 6 is a diagram illustrating a dual mode current steering power amplifier DAC array system 600. The system 600 provides for integrated direct digital to RF conversion and power amplification of input information carrying signals using either polar modulation or quadrature modulation techniques.

The system 600 includes a merge component 602, a first combined array 604a and a second combined array 604b. The first and second combined arrays 604a and 604b include integrated DAC or modulation components 608a and 608b and cascode buffering stages 606a and 606b. The DAC components 608a and 608b include a number of unit cells for performing modulation. The unit cells may utilize switched current sources, switched capacitors, and the like.

The first combined array 604a receives a first portion 612 of input signals. The first portion 612 includes inphase components (I<n:0>) and inphase local oscillator signals (LOI+ and LOI−) for quadrature modulation. For polar modulation, the first portion instead includes phase modulation components (PM+ and PM−) and a section of amplitude modulation components (AM<n:0>). The <n:0> means the number of bits or unit cells is n+1, where n is an integer.

The first DAC component 608a converts or modulates the first portion 612 into an analog signal. The first cascode buffering stage 606a protects the DAC stage 608a and buffers the signal, which is afterwards output by the first combined array 604a as the first RF signal 614.

The second combined array 604b receives a second portion 616 of input signals. The second portion 616 includes quadrature components (Q<n:0>) and quadrature local oscillator signals (LOQ+ and LOQ−) for quadrature modulation. For polar modulation, the second portion includes phase modulation components (PM+ and PM−) and a section of amplitude modulation components (AM<2n+2:n+1>).

The second DAC component 608b converts or modulates the second portion 616 into an analog signal. The second cascode buffering stage 606b protects the DAC stage 608b and buffers the signal, which is output by the second combined array 604b as the second RF signal 618.

The merge component 602 receives the first and second RF signals 614 and 618 and generates an RF output signal 610 (RFOUT+ and RFOUT−). The merge component 602 is shown with a parallel capacitor and inductor configuration, however it is appreciated that variations in the configuration of the merge component 602 are permitted. In one example, the merge component 602 combines the first RF signal 614 with the second RF signal 618 in order to generate the RF output signal 610.

The system 600 generates the RF output signal 610 having a selected modulation. A suitable mechanism, such as selection logic, can be utilized to selectively direct appropriate modulation components to the arrays 604a and 604b and to generate the RF output signal 610 having the selected modulation format.

Figure 7:
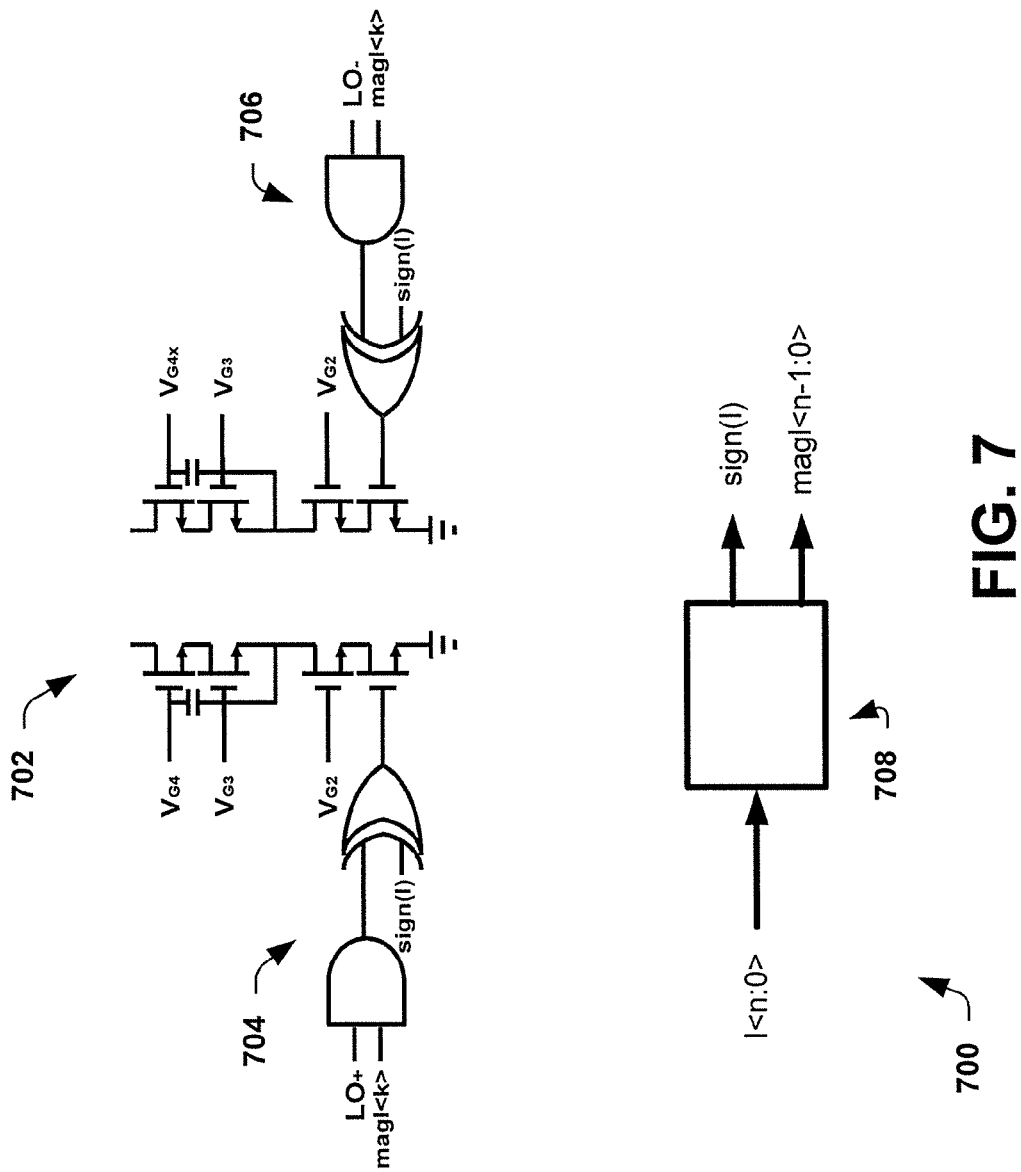
FIG. 7 is a diagram illustrating unit selection logic for a quadrature or polar modulation mode.

FIG. 7 is a diagram illustrating unit selection logic 700 for a quadrature or polar modulation mode. The selection logic 700 can be utilized, for example, with the system 600 to facilitate quadrature modulation. The selection logic 700 is shown in conjunction with integrated power amplifier and DAC components using switched current sources. It is appreciated that variations are contemplated for operation with other modulation modes.

The selection logic 700 includes a unit cell 702, first logic 704, second logic 706, and a sign component 708. The unit cell 702 includes DAC stage and cascode stage portions. In this example, the unit cell 702 may be a portion of the first power array 604a. Further, the unit cell 702 includes stacked cascode devices. Signals Vg2, Vg3, Vg4 and Vg4x provide DC biasing gate voltages for the current source and stacked cascode devices of the unit cell 702.

The first logic 704 includes an AND gate and an XOR gate. For quadrature modulation, the AND gate receives a positive portion of an inphase local oscillator signal (LO+) and a first signal (magI<k>). The AND gate passes the inphase local oscillator signal, which is received by the XOR gate. The XOR gate also receives a sign signal (sign(I)). The XOR gate multiplies the inphase local oscillator signal with the sign signal, effectively changing the sign of the quadrature component signal at an RF frequency. The XOR gate simultaneously operates as the last local oscillator buffer driving ON-OFF switches of the unit cell current sources.

The second logic 706 also includes an AND gate and an XOR gate. For quadrature modulation, the AND gate receives a negative portion of an inphase local oscillator signal (LO−) and the first signal. The AND gate passes the inphase local oscillator signal, which is received by the XOR gate. The XOR gate also receives the sign signal (sign(I)). The XOR gate multiplies the inphase local oscillator signal with the sign signal, effectively changing the sign of the quadrature component signal at an RF frequency. The XOR gate simultaneously operates as the last local oscillator buffer driving ON-OFF switches of the unit cell current sources.

The sign component 708 receives the inphase quadrature components (I<n:0>). The component outputs the corresponding sign signal and magnitude signal.

For a polar modulation mode, the selection logic 700 operates in a similar manner. However, the local oscillator signal received by the AND components is phase modulated and the component 708 receives amplitude modulation components (AM<n:0>) instead. In polar modulation mode, the sign output signal of the component 708 is always set to logical "0".

Figure 8:
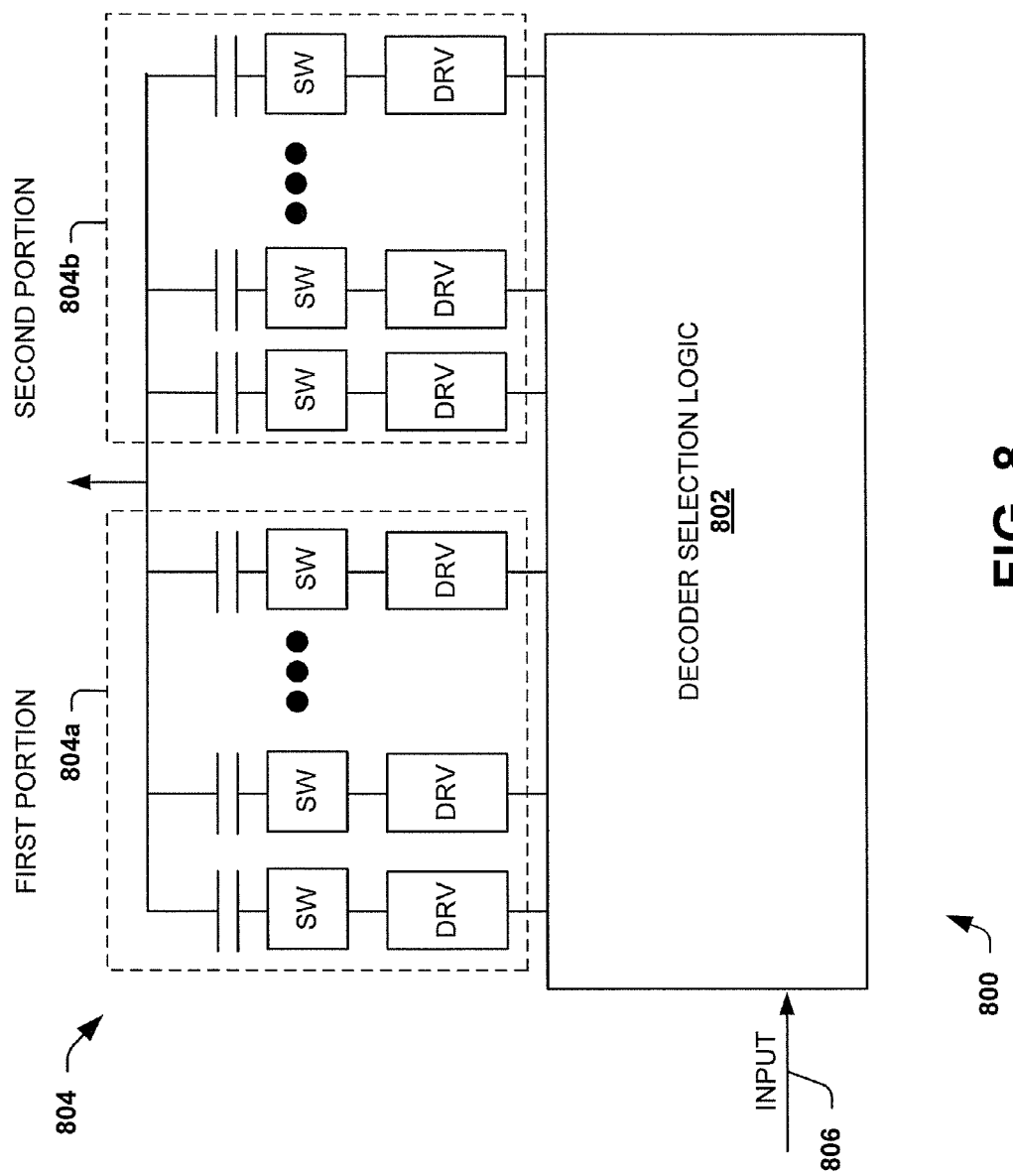
FIG. 8 is a diagram illustrating a switch capacitor integrated power amplifier and DAC.

FIG. 8 is a diagram illustrating a switch capacitor integrated power amplifier and DAC 800. The DAC 800 can be utilized in the system 600 and 400 described above. The DAC 800 utilizes switched capacitors instead of switched current sources.

The power DAC 800 includes a decoder selection logic 802 and an array of switched capacitors 804. The decoder selection logic 802 receives digital signals containing information as input signals 806. The input signals 806 correspond to a selected modulation technique, such as quadrature or polar modulation. The decoder selection logic 802 assigns portions of the input signals 806 to the array of switched capacitors 804.

The array of switched capacitors 804 includes a switch driver, a switch, and a capacitor for each element of the array 804. The array 804 includes a first portion 804a and a second portion 804b. Each of the portions 804a and 804b receives first and portions of the incoming signals. The switches of the array 804 are configured to receive local oscillator signals for quadrature or polar modulation modes of operation.

Figure 9:
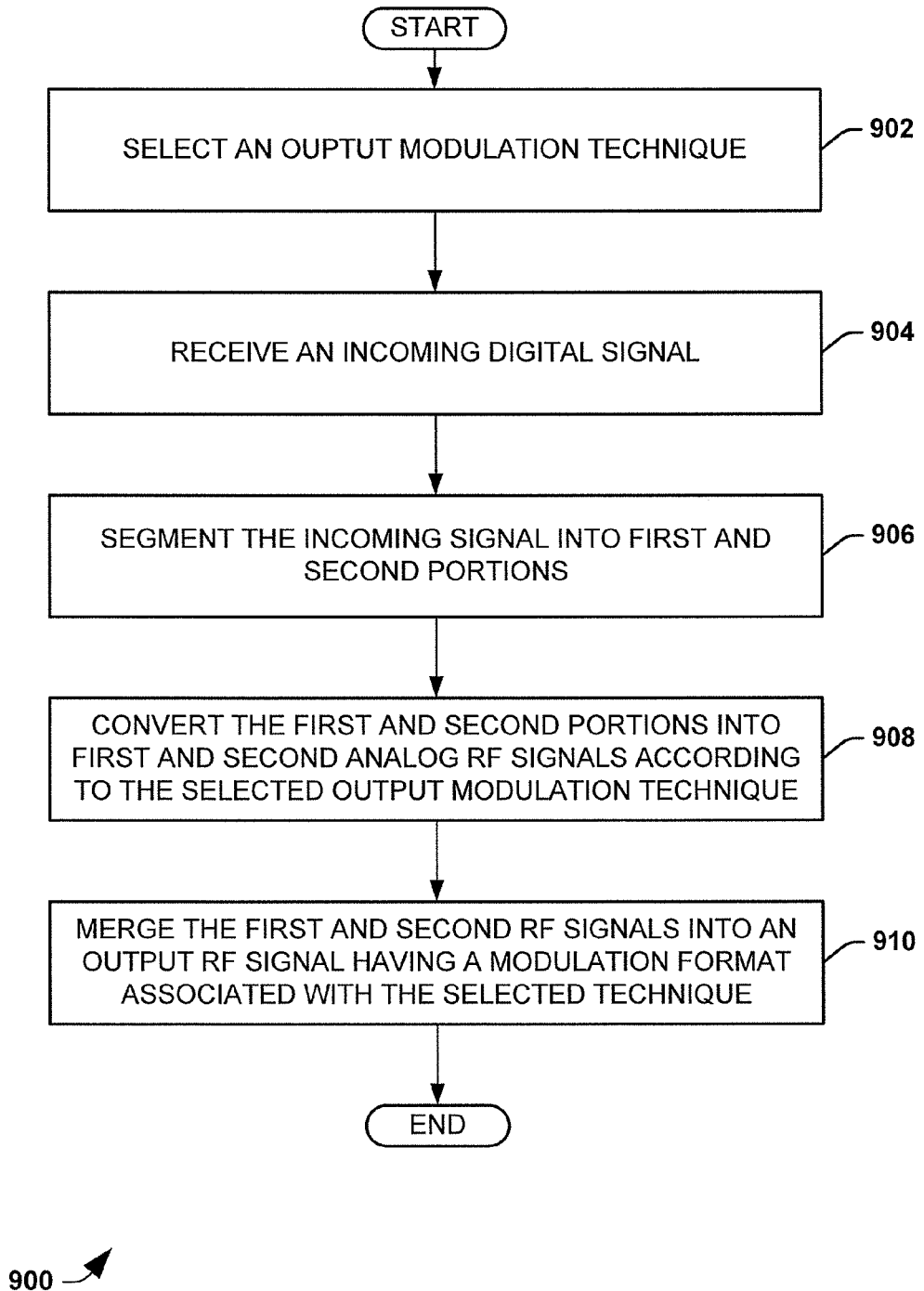
FIG. 9 is a flow diagram illustrating a method of providing digital to RF conversion and power amplification of input information carrying signals represented in one of a plurality of modulation formats.

FIG. 9 is a flow diagram illustrating a method 900 of providing digital to RF conversion and power amplification of input information carrying signals represented in one of a plurality of modulation formats using a selected modulation technique.

The method 900 begins at block 902, wherein an output modulation technique or format is selected. The output modulation technique is one of a plurality of supported modulation techniques that can be provided. The output modulation techniques include, for example, polar modulation and quadrature modulation.

An incoming signal is received at block 904. The input signal is in a format suitable for the selected modulation technique. The incoming signal is a digital signal and includes digital components, such as polar or quadrature modulation components.

The incoming signal is segmented into first and second portions according to the selected output modulation technique at block 906. In one example, the first portion includes inphase components and the second portion includes quadrature components for quadrature modulation. In another example, the first portion includes phase modulation components and a section of amplitude modulation components and the second portion includes phase modulation components and a second section of the amplitude modulation components.

The first portion is converted into a first RF signal and the second portion is converted into a second RF signal at block 908. The first and second input portions signals are converted to RF using the selected output modulation technique. An integrated DAC and power amplifier may be used, as described above, for each portion.

The first RF signal and the second RF signal are merged together to generate an output RF signal having the selected modulation technique at block 910. The output RF signal may then be transmitted via a communication medium, such as an antenna.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

A communication system includes a first DAC array, a second DAC array, and a merge component. The first DAC array is configured to receive a first portion of modulation signals and to generate a first RF signal according to a modulation mode. The second DAC array is configured to receive a second portion of the modulation signals and to generate a second RF signal according to the modulation mode. The merge component is configured to receive the first RF signal and the second RF signal. The merge component is also configured to generate an output RF signal according to the first RF signal and the second RF signal, wherein the output RF signal has a modulation format according to the modulation mode.

A power DAC array system includes unit cells and cascode buffering stages. The unit cells are configured to receive modulation components and to convert the components into analog RF signal components according to a modulation mode. The cascoded buffering stages are connected to the unit cells and are configured to buffer and combine the analog RF signal components into a single RF signal.

A method of providing digital to RF conversion is disclosed. An output modulation technique is selected. Digital incoming signals having modulation components and an input modulation technique are received. The incoming signals are segmented into a first portion and a second portion according to the selected modulation technique. The first portion is converted into a first RF signal and the second portion is converted into a second RF signal according to the selected output modulation technique.

Although the invention has been illustrated and described with respect to one or more implementations, alterations and/or modifications may be made to the illustrated examples without departing from the spirit and scope of the appended claims. For example, although a transmission circuit/system described herein may have been illustrated as a transmitter circuit, one of ordinary skill in the art will appreciate that the invention provided herein may be applied to transceiver circuits as well. Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A communication system supporting multiple modulation techniques, the system comprising:
    a first DAC array configured to receive a first portion of modulation signals and to generate a first RF signal according to a modulation mode;
    a second DAC array configured to receive a second portion of the modulation signals and to generate a second RF signal according to the modulation mode; and
    a merge component configured to receive the first RF signal and the second RF signal and to generate an output RF signal according to the first RF signal and the second RF signal, wherein the output RF signal has a modulation format according to the modulation mode.

2. The system of claim 1, wherein the first RF signal and the second RF signal have a modulation format specified by the modulation mode.

3. The system of claim 2, wherein the modulation mode is polar modulation.

4. The system of claim 2, wherein the modulation mode is quadrature modulation.

5. The system of claim 1, wherein the modulation signals are digital and include modulation components.

6. The system of claim 5, wherein the modulation components include one of quadrature components and polar components.

7. The system of claim 1, further comprising selection logic configured to receive the modulation signals and generate the first portion of modulation signals and the second portion of modulation signals according to the modulation mode.

8. The system of claim 7, wherein the selection logic is configured to set the modulation mode according to a selection signal.

9. The system of claim 1, wherein the first portion includes inphase components and the second portion includes quadrature components.

10. The system of claim 1, wherein the first portion includes phase modulation components and part of amplitude modulation components and the second portion includes phase modulation components and rest of amplitude modulation components.

11. The system of claim 1, wherein the first DAC array and the second DAC array include a number unit cells and wherein cells of the unit cells are turned ON according to an input digital code value.

12. The system of claim 1, wherein the first DAC array is configured to convert the first portion of the modulation signals and then amplify to generate the first RF signal.

13. The system of claim 1, wherein the first portion is about half of the modulation signals.

14. The system of claim 1, wherein the first and second DAC arrays include switched current sources.

15. The system of claim 1, wherein the first and second DAC arrays include switched capacitors.

16. A power DAC array system comprising:
  unit cells configured to receive modulation components and to convert the modulation components into analog RF signal components according to a modulation mode, wherein the modulation components include a first portion and a second portion based on the modulation mode; and
  cascode buffering stages connected to the unit cells and configured to buffer and combine the RF signal components into a single RF signal.

17. The system of claim 16, wherein the unit cells are turned ON or OFF according to a digital control word.

18. The system of claim 16, wherein the first portion of the modulation components include quadrature components or polar components.

19. The system of claim 16, wherein the single RF signal has a modulation format associated with the modulation mode.

20. A method of providing digital to RF conversion, the method comprising:
  selecting an output modulation mode;
  receiving digital incoming signals having modulation components;
  segmenting the incoming signals into a first portion and a second portion according to the selected output modulation mode;
  converting the first portion into a first RF signal and the second portion into a second RF signal according to the selected output modulation mode; and
  merging the first RF signal with the second RF signal to generate an output RF signal having a modulation format associated with the selected output modulation mode.

21. The method of claim 20, wherein the output modulation mode is one of polar modulation and quadrature modulation.

22. The method of claim 20, wherein the incoming signals include phase modulation and amplitude modulation components.

* * * * *